(12) United States Patent
Jeong et al.

(10) Patent No.: US 8,275,155 B2
(45) Date of Patent: Sep. 25, 2012

(54) METHOD FOR FABRICATING MICRO SPEAKER AND MICRO SPEAKER FABRICATED BY THE SAME

(75) Inventors: Byung-gil Jeong, Anyang-si (KR); Hyung-jae Shin, Seongnam-si (KR); Seok-whan Chung, Suwon-si (KR); Dong-kyun Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 887 days.

(21) Appl. No.: 12/186,677

(22) Filed: Aug. 6, 2008

(65) Prior Publication Data
US 2009/0154734 A1    Jun. 18, 2009

(30) Foreign Application Priority Data
Dec. 14, 2007    (KR) .................. 10-2007-0131489

(51) Int. Cl.
*H04R 25/00* (2006.01)
*H01L 21/00* (2006.01)
(52) U.S. Cl. ................... 381/173; 438/51; 257/E21.499
(58) Field of Classification Search .................. 381/173; 438/51; 257/E21.499
See application file for complete search history.

(56) References Cited

U.S. PATENT DOCUMENTS

| | | | | |
|---|---|---|---|---|
| 4,802,952 A * | 2/1989 | Kobori et al. | ................... | 438/51 |
| 5,668,033 A * | 9/1997 | Ohara et al. | .................. | 438/113 |
| 6,436,853 B2 * | 8/2002 | Lin et al. | ........................ | 438/800 |
| 7,449,356 B2 * | 11/2008 | Weigold | ........................... | 438/53 |
| 2002/0121337 A1 | 9/2002 | Whatmore et al. | | |
| 2005/0074919 A1 * | 4/2005 | Patel et al. | .................... | 438/107 |
| 2005/0095813 A1 * | 5/2005 | Zhu et al. | ...................... | 438/459 |
| 2009/0101998 A1 * | 4/2009 | Yen et al. | ...................... | 257/416 |

FOREIGN PATENT DOCUMENTS
JP    2004129223 A    4/2004
KR    1020030090189 A    11/2003

* cited by examiner

*Primary Examiner* — Lex Malsawma
(74) *Attorney, Agent, or Firm* — Sughrue Mion, PLLC

(57) ABSTRACT

A method for fabricating a micro speaker is provided, including forming a package wafer and a device wafer by batch processing, bonding the package wafer and the device wafer to each other, and forming a diaphragm by isotropic-etching a back surface of the device wafer using a xenon difluoride (XeF$_2$). As a result, a micro-electronic-mechanic system (MEMS) technology-based piezoelectric micro speaker having a wide frequency response range is realized, by batch processing, thereby providing simplified structure and processing and reducing fabricating cost.

9 Claims, 7 Drawing Sheets

(a)

(b)

(c)

(d)

(e)

(a)

(b)

(a)

(b)

(c)

METHOD FOR FABRICATING MICRO SPEAKER AND MICRO SPEAKER FABRICATED BY THE SAME

CROSS-REFERENCE TO RELATED APPLICATIONS

This application claims priority from Korean Patent Application No. 10-2007-0131489, filed on Dec. 14, 2007, the entire content of which is incorporated herein by reference.

BACKGROUND OF THE INVENTION

1. Field of the Invention

Structures and methods consistent with the present invention relate to a micro-electro-mechanical system (MEMS)-based micro speaker, and more particularly, to a structure of a micro speaker and a fabricating method thereof.

2. Description of the Related Art

Thanks to rapid advancement of terminals for voice and data communications, smaller and diversified terminals have been provided, with the ability to exchange greatly increased amount of data. These terminals are now required to be slimmer, without compromising the existent performance.

In order to meet such customer demands, many have researched acoustic devices using MEMS, for applications in various fields such as otophone, cellular phones, or PDAs. The applications of MEMS and semiconductor technologies to the fields of acoustic devices such as microphones or micro speakers, have achieved product miniaturization, cost reduction, and compatibility to enable integration with the neighboring circuits.

Mainly, the condenser type and piezoelectric type are used to fabricate the MEMS-based microphones and micro speakers. The piezoelectric type is generally applied to the micro speaker, since this enables a simple structure and fabricating process, omits a need for polarization voltage, and provides a wider frequency response range.

A general piezoelectric speaker is constructed in a manner in which a thin membrane is bonded onto a substrate by vapor-deposition for support, the lower electrode, piezoelectric material, and upper electrodes are bonded on one another in turn by vapor-deposition, and then the back surface of the substrate is etched to form a diaphragm structure.

FIG. 1 illustrates a general piezoelectric micro speaker as an example, before packaging, in which a substrate 1 is provided, support layer 2, a lower electrode 3, a piezoelectric material 4, and an upper electrode 5 are bonded thereon in stack structure by vapor-deposition, and the back surface 6 of the substrate 1 is etched to form a diaphragm structure.

Such piezoelectric micro speaker requires a packaging to be mounted to a designated system, to enable wiring of electric input and output, and to protect the system from outside. For example, additional processes and costs are necessary for the packaging, to protect the active surface that radiates sound, or to protect the back surface for vent holes.

SUMMARY OF THE INVENTION

Exemplary embodiments of the present invention address at least the above problems and/or disadvantages and other disadvantages not described above. Also, the present invention is not required to overcome the disadvantages described above, and an exemplary embodiment of the present invention may not overcome any of the problems described above.

The present invention provides a micro speaker structure having a package prepared by batch processing, and a fabricating method thereof.

According to an aspect of the present invention, there is provided a method for fabricating a micro speaker, including forming a package wafer and a device wafer by batch processing, bonding the package wafer and the device wafer to each other, and forming a diaphragm by isotropic-etching a back surface of the device wafer using a xenon difluoride ($XeF_2$).

The forming of the package wafer includes forming a back cavity on a back surface of a first silicon wafer, wherein the back cavity provides a space for a movement of the diaphragm, and wherein the first silicon wafer has a first side and a second side and both sides of the first silicon wafer are polished, forming a first metal along a surface of the back cavity by vapor-deposition; forming by piercing an electrode connecting hole and a vent hole on an upper portion of the back cavity, and forming an electrode by vapor depositing with a second metal, or plating the electrode connecting hole.

According to the first exemplary embodiment of the present invention, the forming of the device wafer includes stacking a support layer, a first metal layer, a piezoelectric material, and a second metal layer on one another, on a front portion of the second silicon wafer, forming a protection layer on a back surface of the second wafer with either a xenon difluoride ($XeF_2$)-selective metal or an insulating layer formed from a xenon difluoride ($XeF_2$)-selective silicon dioxide ($SiO_2$), and patterning the protection layer.

According to the second exemplary embodiment of the present invention, the forming of the device wafer includes forming a front cavity on a front portion of a third silicon wafer, and a plurality of passing holes extending from a rear portion to the front cavity, forming an insulating layer by vapor-depositing a silicon dioxide ($SiO_2$) on the third silicon wafer, bonding the second wafer and the third silicon wafer in a manner in which the rear portion of the second wafer faces a surface of the third silicon wafer where the cavity is formed, and vapor-depositing a support layer, a first metal layer, a piezoelectric material, and a second metal layer on a front portion of the second wafer.

The wafer bond includes one of a eutectic bond using a metal compound formed from one of Au/Sn, Au/In, Cu/Sn, and a polymer adhesion.

According to an aspect of the present invention, there is provided a micro speaker fabricated according to the method explained above.

BRIEF DESCRIPTION OF THE DRAWINGS

The above and other aspects of the present invention will be more apparent from the following detailed description of exemplary embodiments of the present invention with reference to the accompanying drawings, in which.

DETAILED DESCRIPTION OF THE EXEMPLARY EMBODIMENTS

Hereinafter, exemplary embodiments of the present invention will be described in detail with reference to the accompanying drawings.

Figure 1:
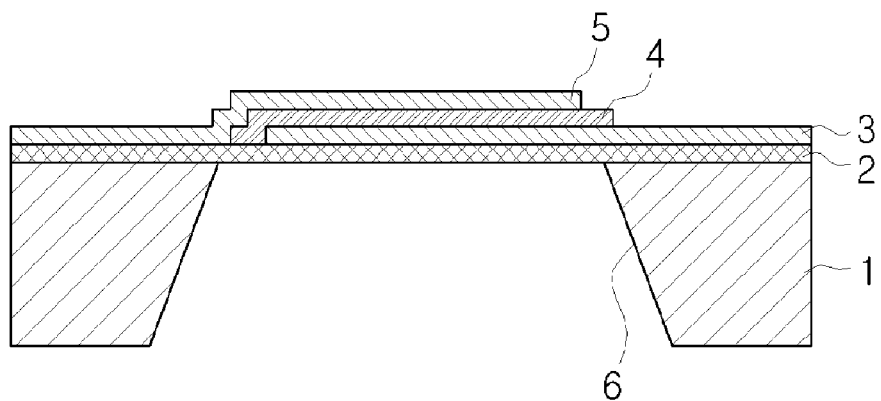
FIG. 1 illustrates a related art piezoelectric micro speaker.
Figure 2:
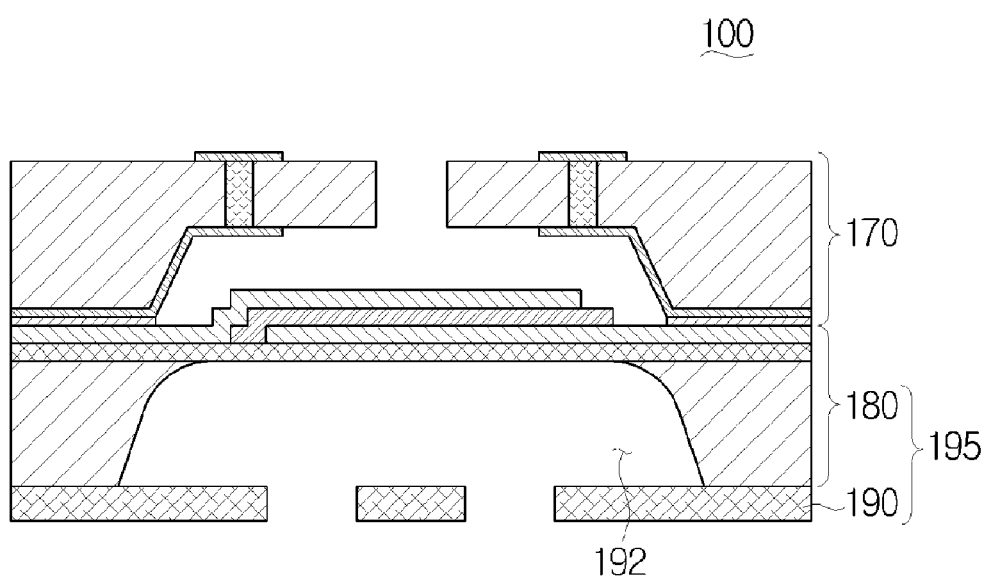
FIG. 2 illustrates a piezoelectric micro speaker according to a first exemplary embodiment of the present invention.

FIG. 2 illustrates a micro speaker 100 according to a first exemplary embodiment of the present invention, in which a package wafer 170 and a device wafer 195, both fabricated by batch processing, are bonded to each other.

As shown, the package wafer 170 and the device wafer 195 are formed by batch processing, using a first and second silicon wafers 110 and 181. The micro speaker 100 is completed by bonding the package wafer 170 and the device wafer 195 are bonded to each other, and then dry-etching the back surface of the device wafer 195 to form a diaphragm 192.

A eutectic bond, which uses a metal compound formed from one of Au/Sn, Au/In, Cu/Sn, may be used as a wafer bond. Alternatively, a polymer adhesion may be used.

Since the package wafer 170 and the device wafer 195 are formed from the same material, and fabricated by plural amount with the first and second silicon wafers 110 and 181 at the same time, mess-production is possible.

The process of forming of the package wafer 170 and the device wafer 195, and bonding the wafers 170 and 195 to fabricate a micro speaker 100 according to the first exemplary embodiment of the present invention will be explained below.

Figure 3:
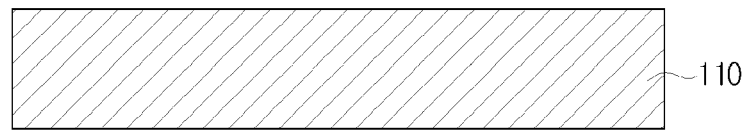
FIG. 3 illustrates a process of fabricating a package wafer of a piezoelectric micro speaker according to an exemplary embodiment of the present invention.
Figure 3:
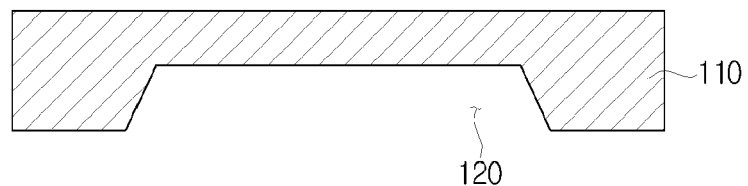
Figure 3:
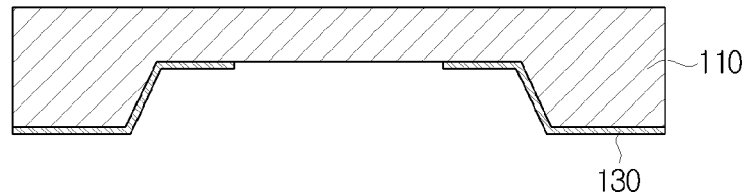
Figure 3:
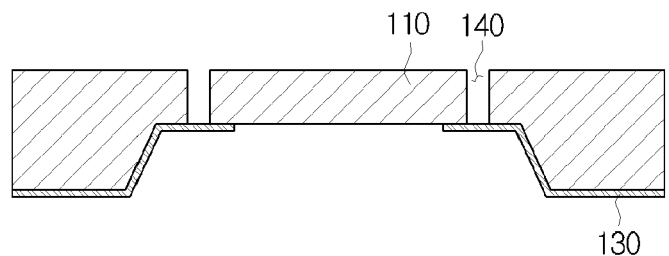
Figure 3:
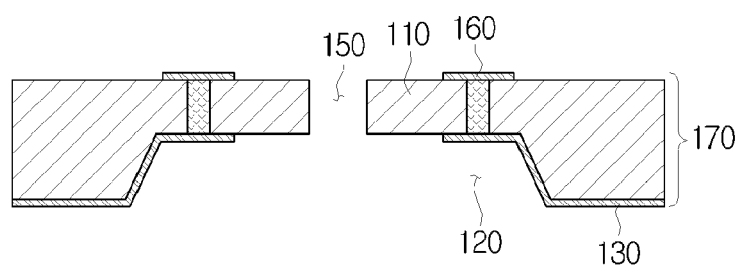

FIG. 3 illustrates the process of forming of the package wafer 170.

The first silicon wafer 110 has both sides polished, and a back cavity 120 formed on the back surface to ensure a space for the movement of diaphragm. A metal is vapor-deposited along the surface of the back cavity 120 to form a metal layer 130. An electrode connecting hole 140 and a vent hole 150 for connection with the back cavity 120, are passed through the front portion of the first silicon wafer 110. The back cavity 120 and the vent hole 150 may preferably be formed by either wet-etching or dry-etching, and the vent hole 150 and the electrode connecting hole 140 should be arranged above the back cavity 120. The metal is vapor-deposited along the electrode connecting hole 140, or plating is filled in the electrode connecting hole 140, to form an electrode 160. The electrode 160 is electrically connected to the metal layer 130 to supply power to the device wafer 195.

Figure 4:
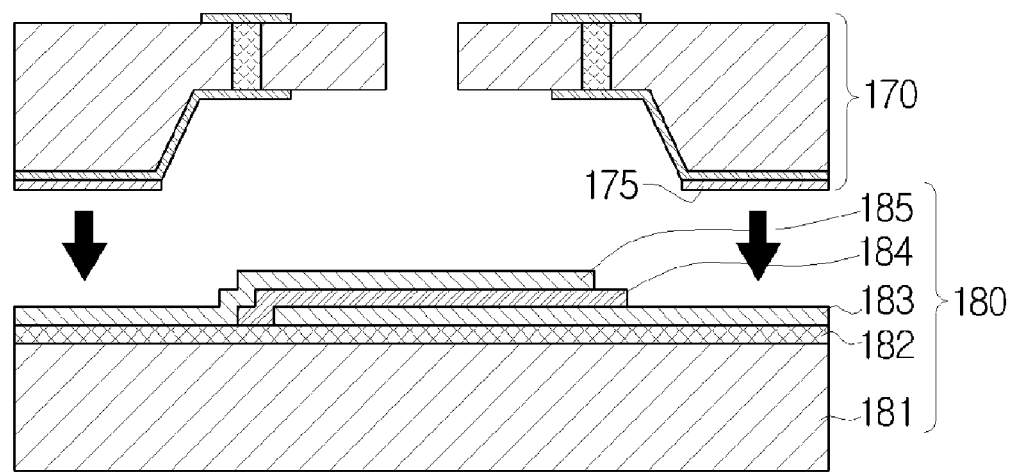
FIG. 4 illustrates the process of bonding the package wafer to the device wafer according to the first exemplary embodiment of the present invention.
Figure 4:
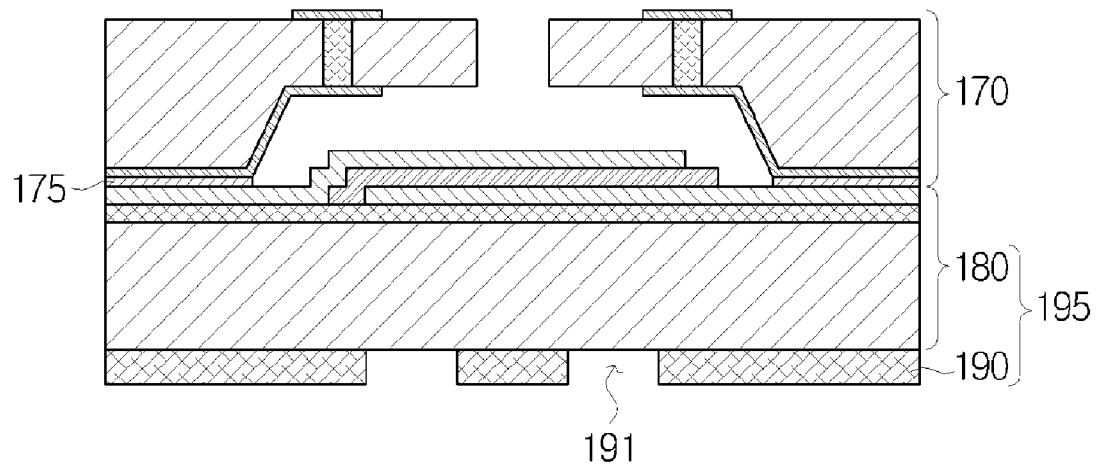
Figure 5:
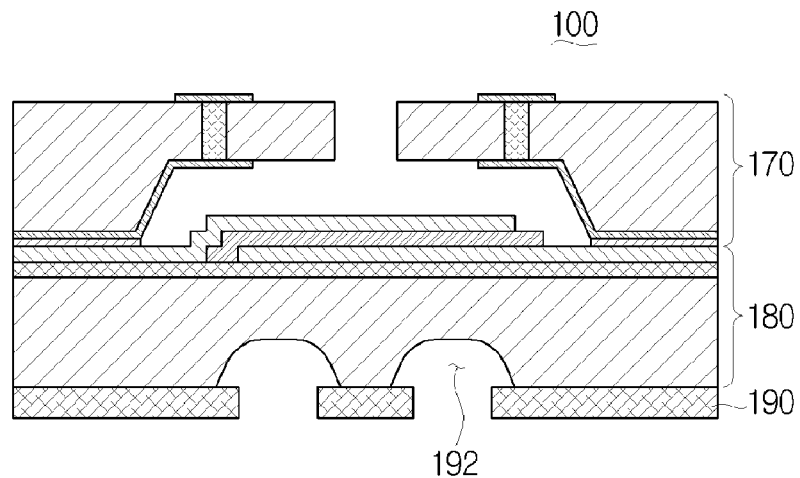
FIG. 5 illustrates the process of forming a diaphragm by dry-etching a back surface of the device wafer of FIG. 4.
Figure 5:
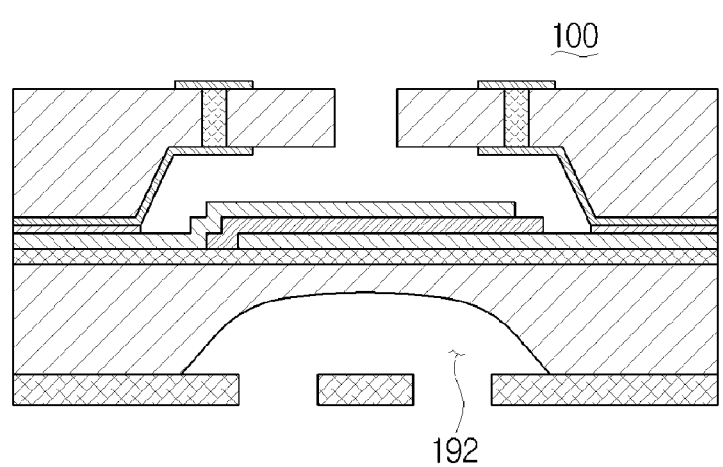
Figure 5:
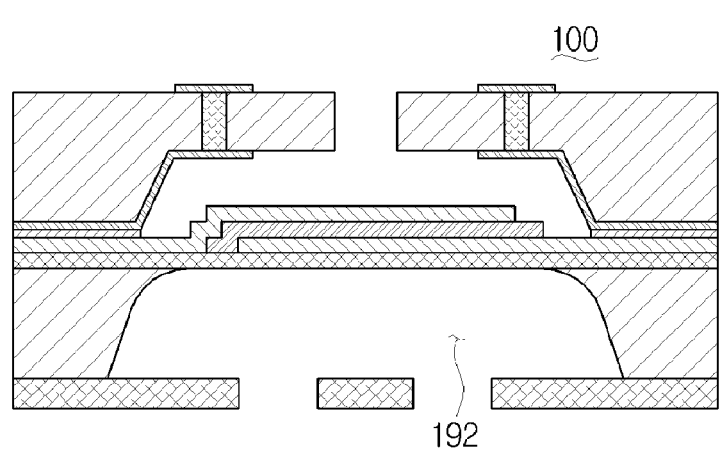

FIGS. 4 and 5 show the process of fabricating the device wafer 195 according to the first exemplary embodiment of the present invention.

In the device wafer 195, the support layer 182, the first metal layer 183, the piezoelectric material 184 and the second metal layer 185 are vapor-deposited in turn on the front surface of the second silicon wafer 181, to form a device 180, and the package wafer 170, fabricated as shown in FIG. 3, is bonded to the upper portion of the device 180. The electrode 160 formed in the package wafer 170 is electrically connected to the first and second metal layers 183 and 185, so that the first metal layer 183 serves as the lower electrode, and the second metal layer 185 serves as the upper electrode.

The package wafer 170 and the device 180 can be bonded to each other using the wafer bond 175, either by a eutectic bond that uses a metal compound formed from one of Au/Sn, Au/In, Cu/Sn, or by polymer adhesion.

A protection layer 190, formed from xenon difluoride ($XeF_2$)-selective metal or silicon dioxide ($SiO_2$), may be formed on the back surface of the second silicon wafer 181, and a diaphragm hole 191 is formed by patterning the protection layer 190 to form a diaphragm.

Referring to FIG. 5, the back surface of the second silicon wafer 181 is isotropic-etched using xenon difluoride ($XeF_2$), to form the diaphragm 192, so that the micro speaker 100 is achieved according to the first exemplary embodiment of the present invention.

Figure 6:
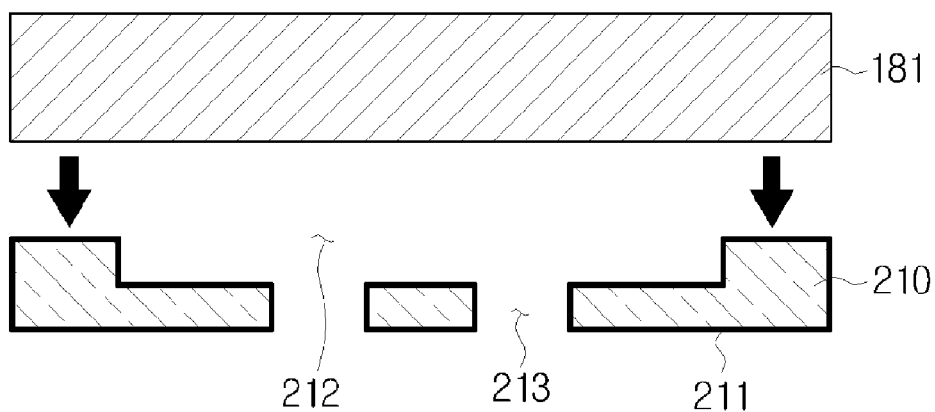
FIGS. 6 and 7 illustrate the process of preparing a device wafer according to a second exemplary embodiment of the present invention.
Figure 7:
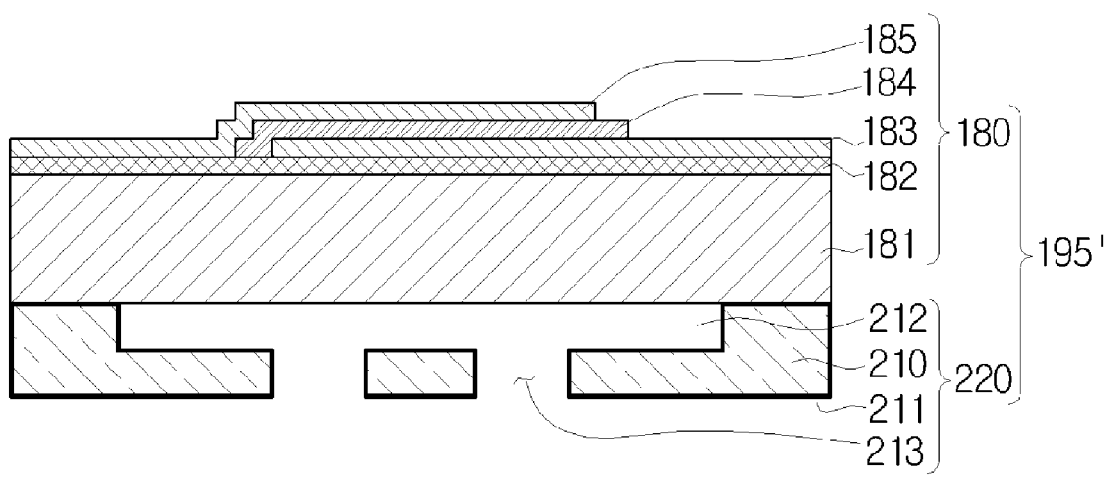
Figure 8:
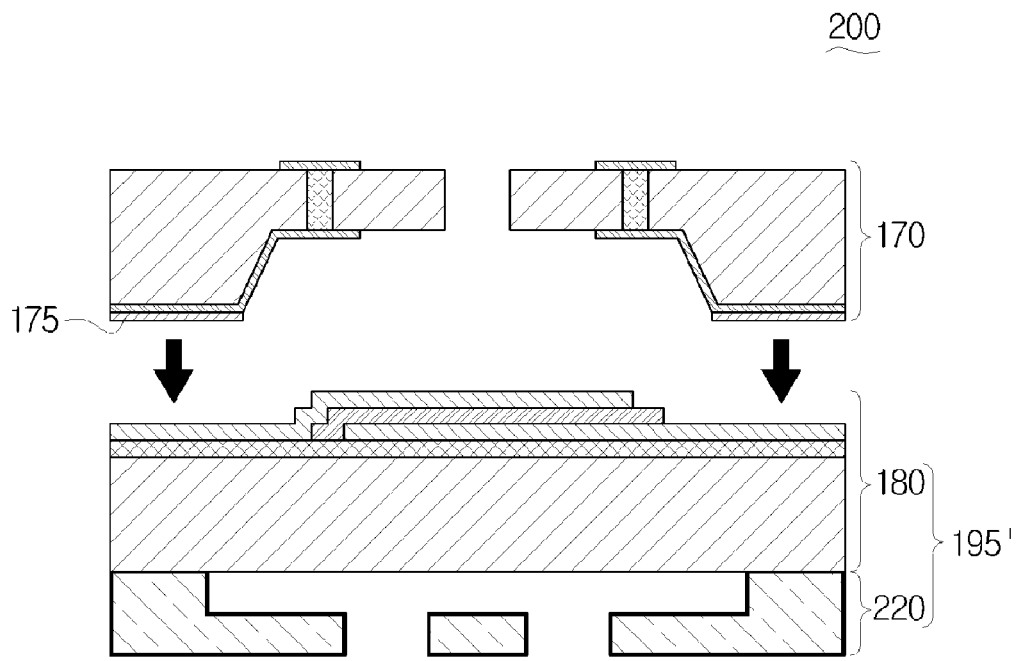
FIG. 8 illustrates the process of bonding the package wafer to the device wafer according to the second exemplary embodiment of the present invention.

The micro speaker 200 (FIG. 9) according to the second exemplary embodiment of the present invention is constructed by bonding the package wafer 170 onto the upper portion of the device wafer 195', formed by the processes illustrated in FIGS. 6 and 7, using wafer bond. Since the package wafer 170 has been explained above in detail, and this will be omitted for the sake of brevity.

The device wafer 195' according to the second exemplary embodiment is constructed by bonding a third silicon wafer 210 onto the back surface of the second silicon wafer 181 on which the device 180 is formed.

Specifically, a front cavity 212 is formed on the front portion of the third silicon wafer 210 by wet or dry etching, and a passing hole 213 is formed on a rear portion to connect to the front cavity 212. The insulating layer 211 is then formed by vapor-depositing silicon dioxide ($SiO_2$) onto the third silicon wafer 210 in which the front cavity 212 and the passing hole 213 are formed.

The second silicon wafer 181 is bonded to the upper portion of the third silicon wafer 210 in which the insulating layer 211, the front cavity 212 and the passing hole 213 are formed, and as illustrated in FIG. 7, the supporting layer 182, the first metal layer 183, the piezoelectric material 184, and the second metal layer 185 are bonded in stack structure on the front portion of the second wafer 181, to form the device 180.

In the same manner as explained above in the first exemplary embodiment of the present invention, the package wafer 170 is bonded to the wafer bond 175, on the upper portion of the device 180.

The wafer bond 175 may be a eutectic bond that uses a metal compound formed from one of Au/Sn, Au/In, Cu/Sn, or alternatively, polymer adhesion may be used. The electrode formed in the package wafer 170 is electrically connected to the first and second metal layers 183 and 185, as explained above in the first exemplary embodiment.

Figure 9:
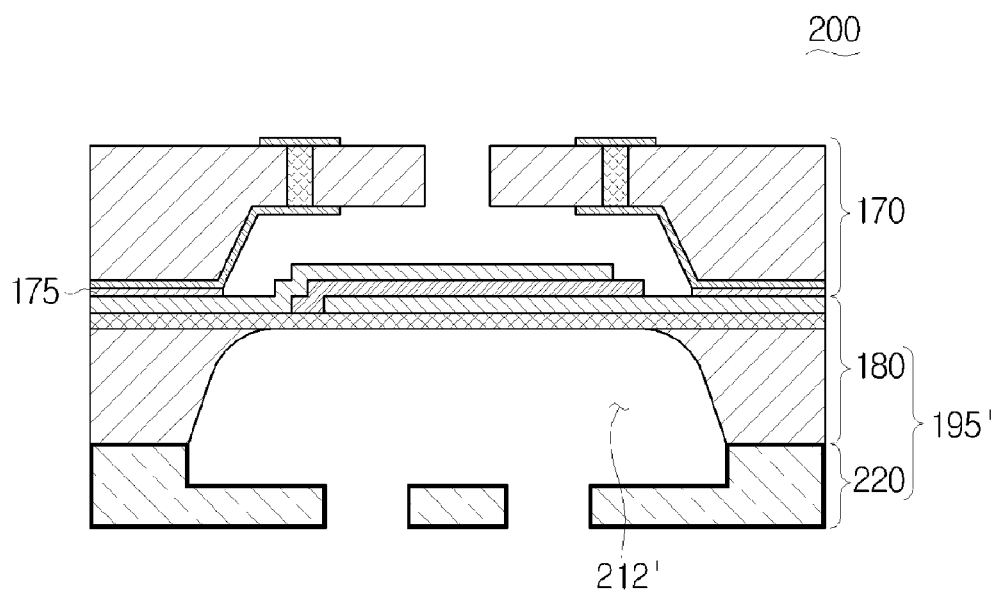
FIG. 9 illustrates a piezoelectric micro speaker according to the second exemplary embodiment of the present invention.

If the package wafer 170 and the device 180 are bonded to each other, as shown in FIG. 9, the back surface of the third silicon wafer 220 is isotropic-etched using xenon difluoride ($XeF_2$), to form a diaphragm 212'. As a result, the micro speaker 200 is completed according to the second exemplary embodiment of the present invention.

As explained above in the first and second exemplary embodiments of the present invention, since the package wafer 170 and the device wafer 195 and 195' are formed from the same material and by batch processing, the fabricating process is simplified, and cost decreases. Furthermore, since the package wafer 170 and the device wafer 195 and 195' are formed from the same material, the wafers 170, 195 and 195' have the same thermal expansion, and are protected from problems related to thermal deformation. Furthermore, with the application of MEMS technique, compact-sized and light-weighted products are provided.

Figure 10A:
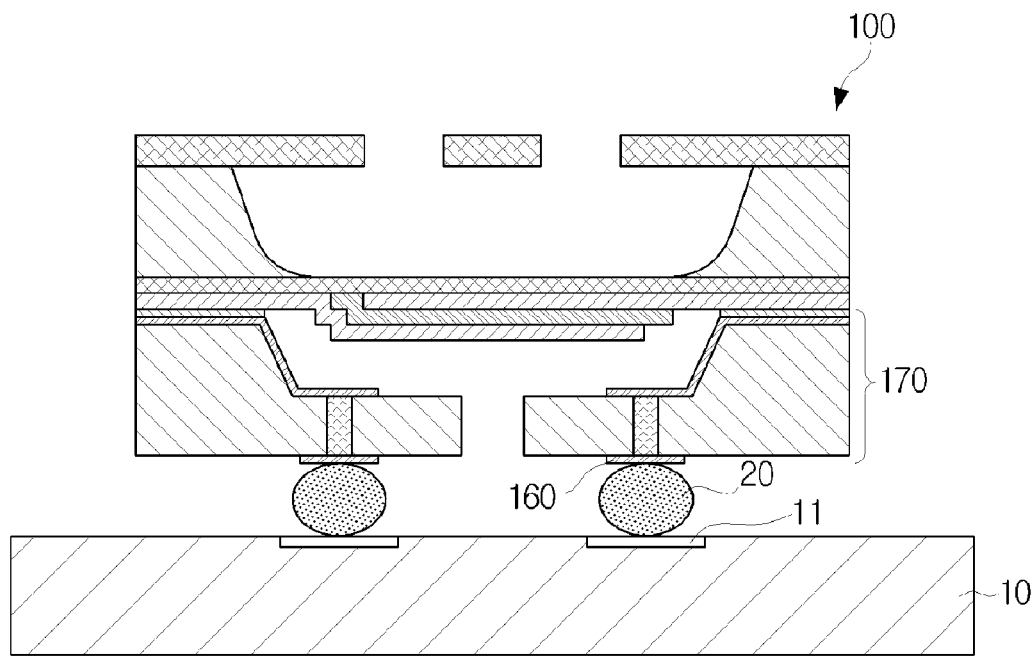
FIGS. 10A and 10B illustrate states in which the piezoelectric micro speakers according to the first and second exemplary embodiments are mounted to the substrate.
Figure 10B:
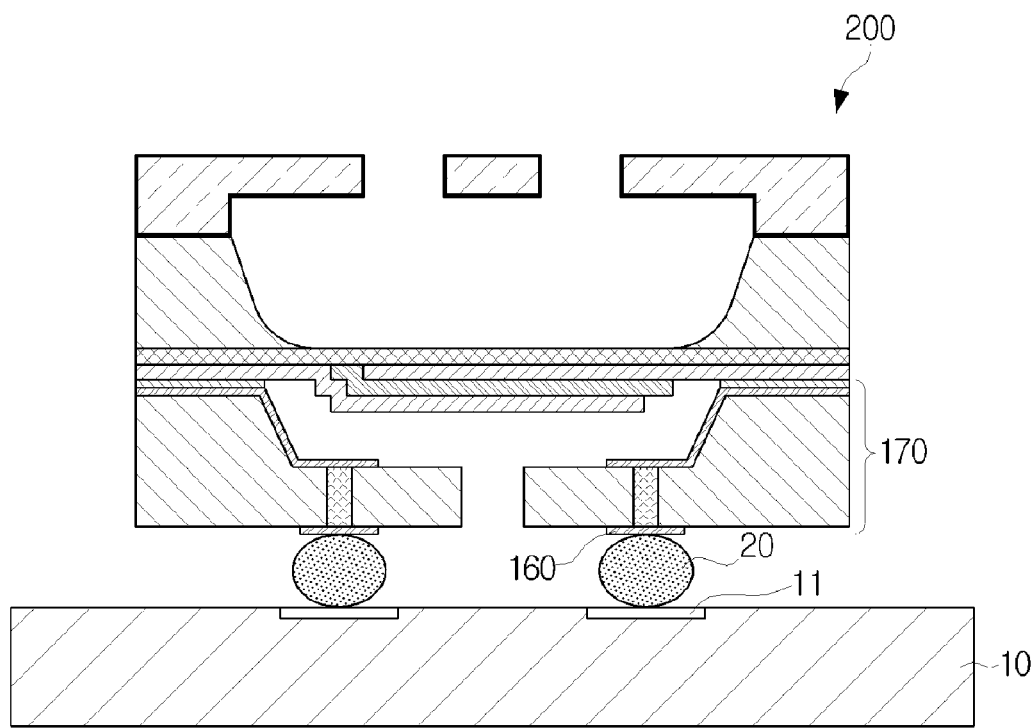

FIG. 10 illustrates states in which the micro speakers 100 and 200 according to the first and second exemplary embodiments of the present invention are mounted to the circuit boards.

As shown, the PCB 10 has the electrode 11 to mount the micro speaker 100 and 200, in which the electrode 11 is connected to the electrode 160 provided in the package wafer 170 by a flip-chip bonding such as solder ball 20. The method for mounting the parts is generally known, and thus will not be explained for the sake of brevity.

The foregoing exemplary embodiments are merely exemplary and are not to be construed as limiting the present invention. The present teachings can be readily applied to other types of apparatuses. Also, the description of the exemplary embodiments of the present invention is intended to be illustrative, and not to limit the scope of the claims, and many alternatives, modifications, and variations will be apparent to those skilled in the art.

What is claimed is:

1. A method for fabricating a micro speaker, the method comprising:
    forming a package wafer and a device wafer by batch processing;
    bonding the package wafer and the device wafer to each other; and
    forming a diaphragm by etching a back surface of the device wafer,
    wherein the forming of the package wafer comprises:
    forming a back cavity on a back surface of the package wafer facing an upper surface of the device wafer, the back cavity providing a space for a movement of the diaphragm;
    forming a first metal along a surface of the back cavity by vapor-deposition;
    forming by piercing, an electrode connecting hole and a vent hole on an upper portion of the back cavity; and
    forming an electrode by performing one of vapor depositing a second metal along the electrode connecting hole, and plating the electrode connecting hole.

2. The method of claim 1,
    wherein the package wafer comprises a first silicon wafer having a first side and a second side,
    wherein the forming of the back cavity on the back surface of the package wafer comprises forming the back cavity on the second surface of the first silicon wafer, and the second sides of the first silicon wafer are polished.

3. The method of claim 2, wherein the forming of the device wafer comprises:
    stacking a support layer, a first metal layer, a piezoelectric material, and a second metal layer on one another, on a front portion of the second silicon wafer;
    forming a protection layer on a back surface of the second wafer with a xenon difluoride ($XeF_2$)-selective metal or an insulating layer formed from a xenon difluoride ($XeF_2$)-selective silicon dioxide ($SiO_2$); and
    patterning the protection layer.

4. A micro speaker fabricated according to the method of claim 3.

5. The method of claim 2, wherein the forming of the device wafer comprises:
    forming a front cavity on a front portion of a third silicon wafer, and a plurality of passing holes extending from a rear portion to the front cavity;
    forming an insulating layer by vapor-depositing a silicon dioxide ($SiO_2$) on the third silicon wafer;
    bonding the second wafer and the third silicon wafer in a manner in which the rear portion of the second wafer faces a surface of the third silicon wafer where the front cavity is formed; and
    vapor-depositing a support layer, a first metal layer, a piezoelectric material, and a second metal layer on a front portion of the second wafer.

6. A micro speaker fabricated according to the method of claim 5.

7. A micro speaker fabricated according to the method of claim 2.

8. The method of claim 2, wherein the diaphragm is formed by isotropic-etching the back surface of the device wafer using a xenon difluoride ($XeF_2$).

9. A micro speaker fabricated according to the method of claim 1.

* * * * *